(12) United States Patent
Heiss et al.

(10) Patent No.: US 11,515,440 B2
(45) Date of Patent: Nov. 29, 2022

(54) SEMITRANSPARENT THIN-FILM SOLAR MODULE

(71) Applicant: CNBM RESEARCH INSTITUTE FOR ADVANCED GLASS MATERIALS GROUP CO., LTD., Bengbu (CN)

(72) Inventors: Andreas Heiss, Penzing (DE); Joerg Palm, Munich (DE); Helmut Vogt, Munich (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 16/649,979

(22) PCT Filed: Sep. 26, 2018

(86) PCT No.: PCT/CN2018/107709
§ 371 (c)(1),
(2) Date: Mar. 23, 2020

(87) PCT Pub. No.: WO2019/062773
PCT Pub. Date: Apr. 4, 2019

(65) Prior Publication Data
US 2020/0266313 A1     Aug. 20, 2020

(30) Foreign Application Priority Data
Sep. 29, 2017  (EP) ..................................... 17194074

(51) Int. Cl.
*H01L 31/0468*    (2014.01)
*H01L 31/0463*    (2014.01)
(Continued)

(52) U.S. Cl.
CPC .. *H01L 31/0468* (2014.12); *H01L 31/022425* (2013.01); *H01L 31/0463* (2014.12); *H01L 31/0465* (2014.12)

(58) Field of Classification Search
CPC ............ H01L 31/0468; H01L 31/0463; H01L 31/0465
See application file for complete search history.

(56) References Cited

U.S. PATENT DOCUMENTS 7,795,067 B1 *  9/2010  Basol .................. H01L 31/0749
                                                       438/57
2009/0205710 A1  8/2009  Kim et al.
(Continued)

FOREIGN PATENT DOCUMENTS

CN        101515609 A      8/2009
CN        101771091 A      7/2010
(Continued)

OTHER PUBLICATIONS

Non-Final Office Action for U.S. Appl. No. 16/650,950, filed Mar. 25, 2020 on behalf of Bengbu Design & Research Institute dated Dec. 24, 2020 14 pages.
(Continued)

*Primary Examiner* — Angelo Trivisonno
(74) *Attorney, Agent, or Firm* — Bayramoglu Law Offices LLC (57) ABSTRACT

A thin-film solar module with a substrate and a layer structure applied thereon comprising a rear electrode layer, a front electrode layer, and an absorber layer arranged between the back electrode layer and the front electrode layer. Serially connected solar cells are formed in the layer region by patterning zones, having a rear electrode layer section. The layer region has at least one linear decoating region. The decoating region has an alternating sequence of optically transparent zones and electrode zones. The opti-
(Continued)

cally transparent zones are rear-electrode-layer-free and the electrode zones are absorber-layer-free and have a rear electrode layer section. The rear-electrode-layer-sections of at least one pair made up of one solar cell of one solar cell string and one solar cell of the other solar cell string are areally connected to one another by the rear-electrode-layer-section of at least one electrode zone.

19 Claims, 4 Drawing Sheets

(51) Int. Cl.
    *H01L 31/0465*     (2014.01)
    *H01L 31/0224*     (2006.01)

(56) References Cited

U.S. PATENT DOCUMENTS

| | | |
|---|---|---|
| 2010/0013037 A1 | 1/2010 | Park et al. |
| 2012/0103416 A1 | 5/2012 | Kwon et al. |
| 2013/0025661 A1* | 1/2013 | Shin .............. H01L 31/0468 136/255 |
| 2013/0050418 A1 | 2/2013 | Nishioka et al. |
| 2013/0319518 A1 | 12/2013 | Doech et al. |
| 2014/0305492 A1 | 10/2014 | Verger et al. |
| 2015/0136198 A1 | 5/2015 | Nam |
| 2016/0126407 A1* | 5/2016 | Cardi ............ H01L 31/0468 438/57 |
| 2016/0211396 A1 | 7/2016 | Karst et al. |
| 2018/0254365 A1 | 9/2018 | Kim |
| 2020/0227578 A1 | 7/2020 | Heiss et al. |
| 2020/0279962 A1 | 9/2020 | Heiss et al. |

FOREIGN PATENT DOCUMENTS

| | | |
|---|---|---|
| CN | 102970569 A | 3/2013 |
| CN | 103155157 A | 6/2013 |
| CN | 103718307 A | 4/2014 |
| CN | 105140310 A | 12/2015 |
| TW | 201019492 A | 5/2010 |
| WO | 2012/029780 A1 | 3/2012 |
| WO | 2014/188092 A1 | 11/2014 |
| WO | 2015/033291 A1 | 3/2015 |

OTHER PUBLICATIONS

Restriction Requirement for U.S. Appl. No. 16/650,590, filed Mar. 25, 2020, on behalf of Bengbu Design & Research Institute. dated Oct. 23, 2020. 8 Pages.
International Search Report, for International PCT App. No. PCT/CN2018/107516 filed on Sep. 26, 2018 on behalf of Bengbu Design & Research Institute. dated Jan. 3, 2019. 4 Pages.
International Search Report, for International PCT App. No. PCT/CN2018/107709 filed on Sep. 26, 2018 on behalf of Bengbu Design & Research Institute. dated Jan. 4, 2019. 3 Pages.
International Search Report for International PCT App. No. PCT/CN2018/107795 filed on Sep. 27, 2018 on behalf of Bengbu Design & Research Institute. dated Nov. 30, 2018. 3 Pages.
Written Opinion for International PCT App. No. PCT/CN2018/107516 filed on Sep. 26, 2018 on behalf of Bengbu Design & Research Institute. dated Jan. 3, 2019. 3 Pages.
Written Opinion for International PCT App. No. PCT/CN2018/107709 filed on Sep. 26, 2018 on behalf of Bengbu Design & Research Institute. dated Jan. 4, 2019. 2 Pages.
Written opinion for International PCT App. No. PCT/CN2018/107795 filed on Sep. 27, 2018 on behalf of Bengbu Design & Research Institute. dated Nov. 30, 2018. 3 Pages.

* cited by examiner

SEMITRANSPARENT THIN-FILM SOLAR MODULE

CROSS REFERENCE TO RELATED APPLICATIONS

The present application is the U.S. national stage of International Patent Application PCT/CN2018/107709 filed internationally on Sep. 26, 2018, which, in turn, claims priority to European Patent Application No. 17194074.5 filed on Sep. 29, 2017.

In open-space systems, large growth in solar modules can be observed; however, applications in the building-integrated setting are currently still moving in a much smaller scale. In light of intensified efforts toward decentralized energy solutions, a real demand is developing to be able to also use façade surfaces for photovoltaic power generation. For architectonic and structural engineering reasons, both flat opaque solar modules and light permeable solar modules are necessary for integration into buildings. Permeability to visible light averaged over the total area of the solar module in the range from 5 to 50% (optical semitransparency) is desirable in order to have, on the one hand, adequate electrical power and, on the other, to ensure sufficient light transmittance. Other areas of application for semitransparent solar modules are noise abatement walls (roadway, railway), privacy barriers in outdoor areas, or walls for greenhouses.

In contrast to crystalline silicon technology (c-Si), in which the solar cells can, in principle, only be realized opaque, thin-film solar cells have the advantage that as a result of the monolithic serial connection electrically and optically active areas as well as surrounding passive regions can be very flexibly designed. In addition, significantly higher efficiency levels can be achieved by chalcopyrite-based absorbers than with absorbers based on amorphous silicon. One characteristic of the process technology in the production of thin-film solar cells is the sequential execution of full-surface coating and local decoating, wherein, for example, for producing the solar cells, different layers are applied directly onto a carrier substrate, which is glued ("laminated") after patterning of the layers to a front-side transparent cover layer to form a weathering-stable composite. Masking processes, as are customary in microelectronics, are avoided by means of the full-surface coating and local decoating. For large thin-film solar modules, masking processes are very cost intensive and time-consuming.

Until now, primarily thin-film silicon has been used as the starting material for absorbers for producing semitransparent modules, in particular in conjunction with a transparent front electrode and a transparent rear electrode. For this, the absorber has been made so thin that the entire layer system is transparent to electromagnetic radiation in the range of infrared and red wavelengths. However, an undesirable color filter effect often develops as a result of the thin absorber.

In contrast, the object of the present invention consists in advantageously improving semitransparent thin-film solar modules known in the prior art as well as their production, wherein the modules should have a relatively large optically active area with noteworthy transparency in the visible light range. Also, the modules should be visually appealing and, in particular, have no color filter effect.

These and other objects are accomplished according to the proposal of the invention by a semitransparent thin-film solar module as well as a method for its production in accordance with the coordinate claims. Advantageous embodiments of the invention are indicated through the features of the subclaims.

In the context of the present invention, the term "transparency" refers to visible-light transmittance of at least 85%. Typically, visible light is in the wavelength range from 380 nm to 780 nm. The term "opacity" refers to visible-light transmittance of less than 5%. Accordingly, an optically transparent zone of a solar cell has visible-light transmittance in the range from 85% to 100%; an opaque zone has visible-light transmittance in the range from 0% (completely opaque) to less than 5%. The term "semitransparency" refers to visible-light transmittance in the range from 5% to less than 85%. In the context of the present invention, the term "semitransparency" is used in connection with visible-light transmittance averaged over the entire area of all solar cells of the thin-film solar module, in other words, the desired semitransparency results from averaging the optical transmittance of opaque and optically transparent regions over all solar cells of the thin-film solar module.

According to the invention, a semitransparent thin-film solar module with integrated serially connected solar cells is presented. In keeping with the above definition of the term "semitransparency", the thin-film solar module has (optically) opaque and optically transparent regions of the solar cells, wherein the semitransparency of the solar cells is the result of averaging the visible-light transmittance over the entire area of all solar cells. The (semi)transparency of a thin-film solar module can be determined in a simple manner by a measurement arrangement, in which, for example, a white light source (visible light source) is arranged on one side of the thin-film solar module and a detector of visible light is arranged on the other side of the thin-film solar module. It is essential here that the detector can detect the light passing through all solar cells of the thin-film solar module (for example, simultaneously) in order to enable averaging the optical transparency of the thin-film solar module over the entire area of the solar cells.

The thin-film solar module according to the invention comprises a substrate with a layer structure with monolithically integrated serial connection of solar cells for photovoltaic energy generation. In keeping with the customary use of the term "thin-film solar module", it refers to modules with a layer structure with a low thickness of, for example, a few microns such that a carrier substrate is required for adequate mechanical stability. The carrier substrate can be made, for example, of inorganic glass, plastic, or metal, in particular, of a metal alloy, and can be designed, depending on the respective layer thickness and the specific material properties, as a rigid plate or a flexible film. The invention refers both to a thin-film solar module in substrate configuration, wherein, for producing the solar cells, the layer structure is applied on a substrate surface facing the light-incident side as well as to a thin-film solar module in superstrate configuration, wherein the substrate is transparent and the layer structure is applied on a substrate surface facing away from the light-incident side.

In a manner known per se, the layer structure comprises a rear electrode layer, a front electrode layer, and a photovoltaically active absorber layer arranged between the rear electrode and the front electrode layer. Preferably, the absorber layer is made of a chalcopyrite compound, which is, for example, a semiconductor from the group copper indium/gallium disulfide/diselenide ($Cu(In,Ga)(S,Se)_2$), for example, copper indium diselenide ($CuInSe_2$ or CIS) or related compounds. The absorber layer is typically opaque or, if it is very thin, at least frequency-selectively transparent such that, generally speaking, a certain color filter effect or frequency filter effect occurs. The rear electrode layer is typically opaque. The front electrode layer is typically optically transparent, in particular in the case of thin-film solar modules in substrate configuration, since passage of light to the layer structure must be enabled.

In the layer structure, the integrated serially connected solar cells are formed conventionally by means of patterning zones. Thus, at least the rear electrode layer is subdivided into sections by first patterning lines P1, which sections form the rear electrodes of the solar cells. In addition, at least the absorber layer is subdivided into sections by second patterning lines P2, which sections are in each case absorbers associated with the solar cells, and at least the front electrode layer is subdivided into sections by third patterning lines P3, which sections form the front electrodes of the solar cells. Solar cells adjacent one another are electrically connected serially to one another via the second patterning lines P2, wherein the front electrode of one solar cell is electrically connected to the rear electrode of the adjacent solar cell and typically, but not mandatorily, directly contacts it.

The patterning lines are, generally speaking, arranged in the order P1-P2-P3. A patterning zone is formed by a direct sequence of first to third patterning line P1-P2-P3. The patterning zone can be, for example, linear, in particular, rectilinear. The patterning lines are, generally speaking, arranged parallel to one another in the sequence comprising the first to third patterning line P1-P2-P3 and run, for example, parallel to one edge of a rectangular or square module. For example, the patterning lines P1-P2-P3 can in each case extend all the way to the edge of the layer structure. The direction of extension of the patterning lines P1-P2-P3 can be defined as module or solar cell width; the direction perpendicular thereto, as module or solar cell length. Each solar cell has, for example, a width that corresponds to the width of the layer structure.

In keeping with the common use of the term, "solar cell" refers, in the context of the present invention, to a region of the layer structure (hereinafter also referred to as "layer region") that has a front electrode layer section that forms the front electrode of the solar cell, an absorber layer section that forms the photovoltaically active absorber of the solar cell, and a rear electrode layer section that forms the rear electrode of the solar cell, and is delimited by two patterning zones directly adjacent one another, consisting in each case of the patterning lines P1-P2-P3. This applies by analogy in the edge region of the module, wherein, instead of a patterning zone, there is a connection section for electrically contacting the serial connection of the solar cells such that the solar cell is defined by the layer region with a front electrode, absorber, and rear electrode, which is situated between a patterning zone and the immediately adjacent connection section. Typically, the layer region extends along the complete length of the adjacent patterning zone(s). Each patterning zone forms a photovoltaically inactive (dead) zone, whereas, in contrast, the layer region has a (single) photovoltaically active zone and is photovoltaically active.

According to the present invention, the layer structure has at least one linear decoating region (decoating line) by which the serially connected solar cells are subdivided into at least two solar cell strings. The at least one linear decoating region is photovoltaically inactive over its entire extension. The at least one linear decoating region thus divides the serially connected solar cells into a first solar cell string with first solar cells and a second solar cell string with second solar cells. The first solar cells and second solar cells are in each case adjacent the linear decoating region. A first solar cell of the first solar cell string and a second solar cell of the second solar cell string positioned opposite thereto form in each case a pair of solar cells in the context of the present invention. Each solar cell has a rear electrode layer section or rear electrode.

The linear decoating region has an alternating sequence of optically transparent zones and electrode zones or is composed thereof. The optically transparent zones can, in particular, be surrounded by edge zones, the electrode zones merely being parts of the edge zones. In the alternating sequence of optically transparent zones and electrode zones, an optically transparent zone is in each case situated between two electrode zones and/or an electrode zone is in each case situated between two optically transparent zones. Each optically transparent zone is rear-electrode-layer-free and preferably also absorber-layer-free. Each electrode zone is absorber-layer-free, but has a section of the rear electrode layer.

It is essential here that the rear-electrode-layer-sections (i.e., rear electrodes) of at least one pair made up of one solar cell of one solar cell string and one solar cell of the other solar cell string (i.e., one pair, consisting of a first solar cell of the first solar cell string and a second solar cell of the second solar cell string immediately adjacent the first solar cell) are areally connected to one another by the rear-electrode-layer-section of at least one electrode zone. The rear electrodes or rear-electrode-layer-sections of the two solar cells are thus areally continuous. The absorber layer is, however, not continuous since it is completely subdivided by the linear decoating region. The solar cells of different solar cell strings arranged in a row perpendicular to the linear decoating region (for example, parallel to the patterning zones) are thus directly connected to one another electrically in a serial connection.

Advantageous effects can be achieved by means of the continuous rear electrodes of the solar cells. In particular, the problem of relatively high sensitivity to local shading is avoided. Another important effect is the avoidance of hot spots, i.e., sites of local overheating due to high current density. In addition, the disadvantageous effects of layer inhomogeneities can be avoided since the continuous rear electrodes of the solar cells serve as potential-compensating surfaces.

Typically, the at least one linear decoating region extends continuously over a plurality of solar cells, in particular over all serially connected solar cells, with the serial connection of solar cells subdivided by the linear decoating region into individual serially connected solar cell strings. According to the invention, the rear electrodes of solar cells are serially connected in a direction perpendicular to the linear decoating region.

Advantageously, all solar cells of the thin-film solar module are serially connected electrically in respective rows perpendicular to the linear decoating region by the electrode zones, wherein it is conceivable that this does not apply to individual solar cells such that the rear electrodes of at least one solar cell pair made up of a first solar cell and a second solar cell are not areally connected to one another and are not directly connected electrically.

In an advantageous embodiment of the thin-film solar module according to the invention, the at least one linear decoating region is arranged perpendicular to the patterning zones. However, it is also possible for the at least one linear decoating region to be arranged at a (non-0°) angle different from 90° oblique to the patterning zones. In principle, the at least one linear decoating region can be arranged at any angle oblique to the patterning zones.

In a particularly advantageous embodiment of the invention, the layer structure is subdivided by a plurality of linear decoating regions into a parallel arrangement, wherein two adjacent solar cell strings of serially connected solar cells are created by each linear decoating region (i.e., a first solar cell string with first solar cells and a second solar cell string with second solar cells). In the inner region of the layer structure, the second solar cell string of a linear decoating region is identical to the first solar cell string of an immediately adjacent linear decoating region and vice versa.

The optically transparent zones can, in principle, have any shape. Preferably, the transparent zones are in each case linear, punctiform, circular disc-shaped, or square.

Advantageously, the ratio of the total area of all optically transparent zones to the total area of all solar cells is in the range from 5% to 50%. The optical visible-light transparency averaged over the thin-film solar module is preferably in the range from 5% to 50% and is, in particular, 20%. In this manner, on the one hand, relatively high electrical output can be achieved while, on the other, the optical transmittance is adequately high for practical applications such that a good compromise for the conflicting properties of output and optical transparency can be achieved.

In an advantageous embodiment of the thin-film solar module according to the invention, at least one optically transparent zone is surrounded by an immediately adjacent edge zone that is absorber-layer-free but has a section of the rear electrode layer. As already pointed out, the electrode zones are in each case understood to be a component of an edge zone, in other words, the edge zone of the optically transparent zone includes the electrode zones adjacent the optically transparent zone. The structure of electrode zones and edges zones is thus identical.

When a thermal laser process is used for a decoating process for producing an optically transparent zone, for example, by using a pulsed laser beam with a pulse duration in the range from 5 to 50 nanoseconds, the risk generally exists for short-circuit current paths ("shunts") to develop on the edges of the decoated areas, increasing power losses. This disadvantageous effect can be avoided by partial decoating in the edge zones and the efficiency of the module can be advantageously improved.

According to the invention, it is preferable for the ratio of the total area of the optically transparent zones to the total area of the edge zones to be greater than 1, preferably greater than 10. By this means, the advantageous effects mentioned can be achieved satisfactorily without sustaining excessive power loss through the photovoltaically inactive edge zones.

The invention further extends to a method for producing a thin-film solar module implemented as described above. The method comprises the following steps:

First, a flat substrate is provided. A rear-electrode-layer is deposited on one side of the substrate. The rear electrode layer can be deposited directly onto a surface of the substrate. Alternatively, at least one additional layer can be situated between the substrate and the rear electrode layer. An absorber layer is deposited over the rear electrode layer. The rear electrode layer is situated between the substrate and the absorber layer. The absorber layer can be deposited directly onto one surface of the rear electrode layer. Alternatively, at least one additional layer can be situated between the rear electrode layer and the absorber layer. A front electrode layer is deposited over the absorber layer. The absorber layer is situated between the front electrode layer and the rear electrode layer. The front electrode layer can be deposited directly onto a surface of the absorber layer. Alternatively, at least one additional layer can be situated between the front electrode layer and the absorber layer. Typically, at least one buffer layer is situated between the absorber layer and the front electrode layer. A layer structure is formed by the layer sequence at least consisting of the rear electrode layer, the absorber layer, and the front electrode layer.

At least the rear electrode layer is patterned (subdivided) by first patterning lines (P1). The patterning of the rear rear electrode layer is typically, but not mandatorily, done before depositing the absorber layer. At least the absorber layer is patterned (subdivided) by second patterning lines (P2). The patterning of the absorber layer is typically, but not mandatorily, done before depositing the front electrode layer. At least the front electrode layer is patterned (subdivided) by third patterning lines (P3). The creation of the patterning lines is typically done in the order: P1-P2-P3. A direct sequence of a first patterning line (P1), a second patterning line (P2), and a third patterning line (P3) forms a patterning zone (14), with a monolithic serial connection of solar cells being formed by the patterning zones. The solar cells have in each case a rear electrode layer section, due to the subdivision of the rear electrode by the first patterning lines (P1).

Optically transparent zones, which are in each case rear-electrode-layer-free, are also created by section-wise removal at least of the rear electrode layer. In addition, electrode zones, which are in each case absorber-layer-free, but have a rear electrode layer section, are created by section-wise removal at least of the absorber layer. The optically transparent zones and electrode zones are implemented such that they are arranged in an alternating sequence and, together, form at least one linear decoating region, by which the serially connected solar cells are subdivided into at least two solar cell strings. It is essential here for the optically transparent zones and the electrode zones to be implemented such that the rear-electrode-layer-sections of at least one pair made up of one solar cell of one solar cell string and one solar cell of the other solar cell string by the rear-electrode-layer-section at least of one electrode zone are areally connected to one another.

According to one embodiment of the method according to the invention, the optically transparent zones are produced by section-wise removal at least of the rear electrode layer by irradiation with a pulsed laser beam and/or by mechanical material removal.

According to another embodiment of the method according to the invention, the electrode zones, and, optionally, edge zones are produced by section-wise removal at least of the absorber layer by irradiation with a pulsed laser beam and/or mechanical material removal.

Generally speaking, the optically transparent zones can be created before making the patterning zones, in other words, during the process of the formation and monolithic serial connection of the solar cells, or after making the patterning zones, in other words, after creating the monolithic serial connection of the solar cells. The same is true for the electrode zones as well as the optionally provided edge zones, which can be created during or after making the patterning zones.

In an advantageous embodiment of the invention, the optically transparent zones are created before making the patterning zones, and the electrode zones, as well as, optionally, the edge zones are created after making the patterning zones.

Advantageously, such a method includes a step in which the optically transparent zones are produced by section-wise removal at least of the rear electrode layer before depositing the absorber layer. The decoating of the rear electrode layer is preferably done by irradiation with a laser beam. The method includes a further step in which the electrode zones, as well as, optionally, the edge zones, are produced after depositing the absorber layer and front electrode layer, as well as after producing the third patterning lines (P3), by section-wise removal at least of the absorber layer and the front electrode layer. The decoating of the absorber layer and the front electrode layer is preferably done by mechanical material removal.

In another advantageous embodiment of the invention, the optically transparent zones and electrode zones, as well as, optionally, the edge zones, are produced only after making the patterning zones, in other words, after producing the monolithic serial connection of the solar cells. This procedure has the advantage that serial connections of solar cells of thin-film solar modules produced conventionally can be subjected to the method according to the invention in order to provide the thin-film solar modules with the desired semitransparency. The methods already used for producing serially connected solar cells can advantageously be retained.

Advantageously, such a method for producing optically transparent zones that are surrounded by edge zones includes a step in which at least the absorber layer is removed in sections in processing zones. The processing zones correspond in their dimensions in each case to the dimensions of the optically transparent zone and edge zones to be produced. Here, the optically transparent zones are produced in the inner regions of the processing zones and the edge zones are produced in edge regions of the processing zones surrounding the inner region in each case. Layer removal in the processing zones is preferably done by mechanical material removal. The method includes a further step wherein at least the rear electrode layer is removed in the inner regions of the processing zones, by which means the optically transparent zones are produced. The edge regions, which surround the rear-electrode-layer-free inner regions of the processing zones, form the absorber-layer-free edge zones, which do however have a section of the rear electrode layer. Layer removal in the inner regions is preferably done by irradiation with a pulsed laser beam.

According to one embodiment of the invention, the optically transparent zones are produced by irradiation at least of the rear electrode layer, in particular of the layer structure, with a pulsed laser beam, with the pulses having a pulse duration of less than 1 nanosecond. Alternatively, the optically transparent zones are produced by irradiation at least of the rear electrode layer, in particular of the layer structure, with a pulsed laser beam, with the pulses having a pulse duration of at least 1 nanosecond. Also conceivable is mechanical material removal, for example, by needle writing, brushing, or scraping. Preferably, a pulsed laser beam, whose pulse has a duration of less than 1 nanosecond, particularly preferably less than 100 picoseconds, is used for producing the optically transparent zones. As experiments by the inventors revealed, the use of laser pulses with a longer pulse width in the range, for example, from 5 to 50 nanoseconds result in local damaging of the layer structures due to high heat influx into the absorber layer and the production of fused connections between the front and the rear electrode layer. Surprisingly, it was advantageously possible to significantly reduce these disadvantageous effects through the use of laser pulses with a duration of less than 1 nanosecond.

Preferably, even the electrode zones, as well as, optionally, the edge zones, can be produced by irradiation at least of the absorber layer with a pulsed laser beam, wherein the pulses have a pulse duration of less than 1 nanosecond. Alternatively, layer removal can be done by mechanical material removal, for example, by needle writing, brushing, or scraping. Particularly advantageously, a laser beam whose pulses have a duration of less than 1 nanosecond, preferably less than 100 picoseconds, is also used for producing the edge zones surrounding the optically transparent zones, in order to avoid producing fused connections.

The selective removal of layers in the layer structure using a laser beam for producing optically transparent zones and electrode zones, as well as, optionally, edge zones can be achieved, in particular, by altering one or more of the following process parameters:
 laser power,
 traveling speed of the laser beam relative to the irradiated surface of the layer structure or substrate,
 laser pulse repetition rate,
 pulse duration,
 on- or off-period of the laser.

In particular, the depth of the hole produced in particular in the layer structure can be varied by spatial overlapping of laser pulses, by which means, for example, in the case of edge zones, essentially, only the layers above the rear electrode layer can be removed.

The production of transparent zones and electrode or edge zones by means of laser pulses can be done, for example, in a single-stage procedure during a single process step, for example, by changing the process parameters irradiation power and/or repetition rate of the laser pulses. Here, in each case an optically transparent zone and then an electrode zone or an edge zone are produced. Also possible, however, is a two-stage procedure wherein all optically transparent zones are produced in a first process step and all electrode zones or edge zones are produced in a further process step with altered process parameters. Here, the order is irrelevant.

In an embodiment of the invention advantageous in terms of cost, the optically transparent zones in the layer structure (i.e., making the patterning zones) are produced using a pulsed laser beam of a laser beam source, wherein the pulses of the laser beam have a pulse duration of more than 1 nanosecond, in particular in the range from 5 to 50 nanoseconds. Then, the electrode zones, as well as, optionally, the edge zones are produced using a pulsed laser beam of a laser beam source wherein the pulses of the laser beam have a duration of less than 1 nanosecond, preferably less than 100 picoseconds. Alternatively, the electrode zones, as well as, optionally, edge zones, can be produced using mechanical material removal in the layer structure, for example, by needle writing, brushing, or scraping. Preferable for economic reasons is the use of mechanical material removal in the layer structure for producing the edge zones.

In the method according to the invention, layer removal in the layer structure (after making the patterning zones) can be done by irradiation from the side of the layer structure using a pulsed laser for producing the optically transparent zones and electrode zones, as well as, optionally, edge zones. Alternatively, layer removal can be done through a transparent substrate ("ablation"). To this end, the layer structure is applied on a transparent substrate, for example, glass. During ablation, the laser energy introduced is absorbed on the rear electrode layer, with a small part of the rear electrode vaporizing, such that the rear electrode layer with the complete layer structure above it bulges due to the expanding gas. This happens until the bulged region breaks off from the surrounding layer stack in a circular shape. As a result of the breaking off, the edges of the circular region remain shunt-free since no appreciable laser energy has melted this edge region or even fused rear and front electrodes. In this manner, transparent zones with a relatively small proportion of shunt paths can be produced, by which means performance losses of the module can be reduced.

The various embodiments of the invention can be realized individually or in any combinations. In particular, the features mentioned above and hereinafter can be used not only in the combinations indicated but also in other combinations or in isolation without departing from the scope of the invention.

The invention is now explained in detail using exemplary embodiments and referring to the accompanying figures. They depict, in simplified, not to scale representation.

DETAILED DESCRIPTION OF THE DRAWINGS

Figure 1:
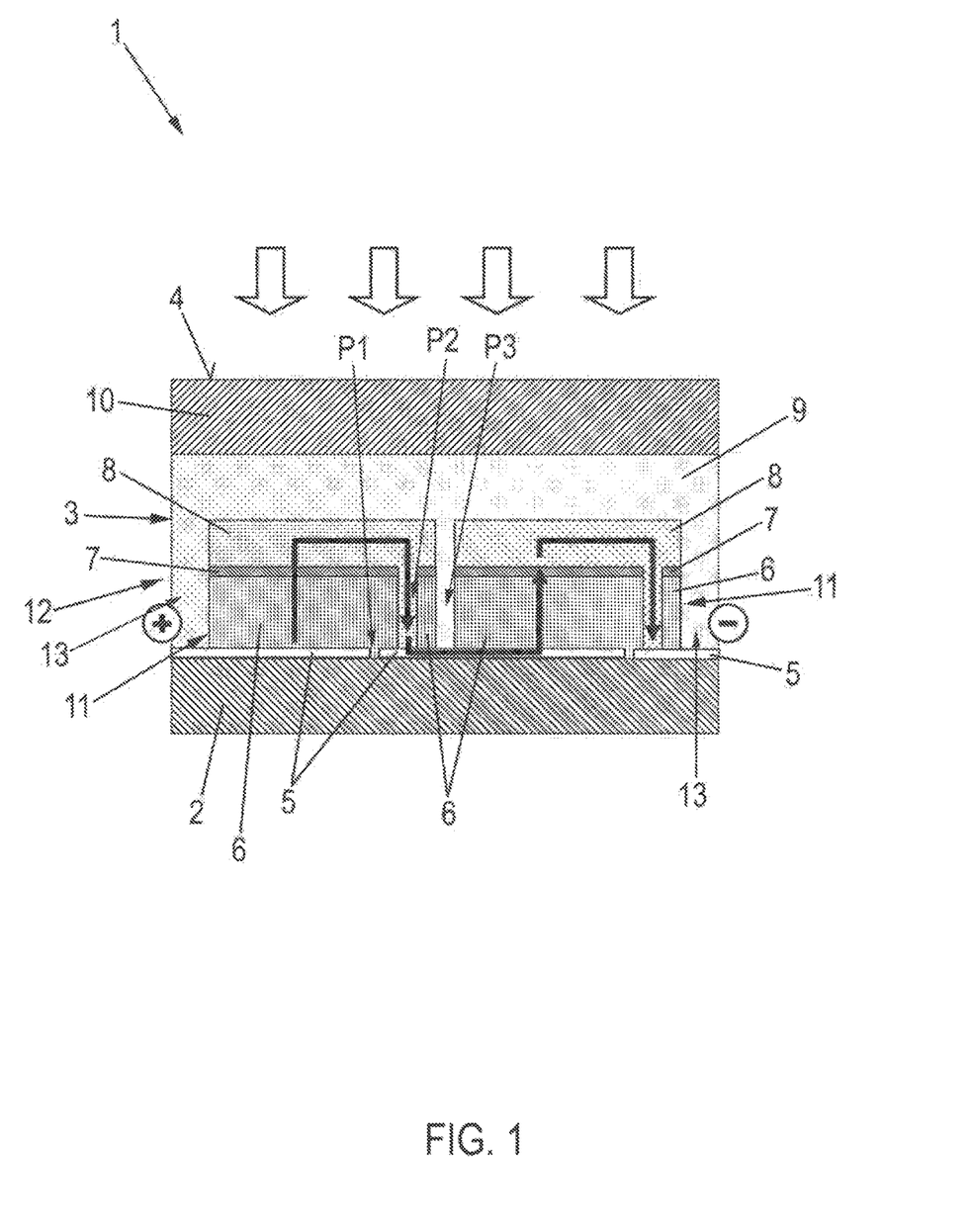
FIG. 1 a schematic representation of the integrated serial connection of solar cells according to one embodiment of the thin-film solar module according to the invention in cross-section.

FIG. 1 schematically illustrates a thin-film solar module according to the present invention referenced as a whole with the number 1 using a cross-sectional view. The thin-film solar module 1 comprises a plurality of solar cells 11 serially connected one to another in integrated form, wherein in a greatly simplified manner only two solar cells 11 are depicted. Of course, generally speaking, in the thin-film solar module 1, a large number of solar cells 11 (for example, approximately 100-150) are serially connected.

The thin-film solar module 1 has a composite pane structure in substrate configuration, in other words, it has a first substrate 2 with a layer structure 3 made of thin films applied thereon, wherein the layer structure 3 is arranged on a light-entry side surface of the first substrate 2. Here, the first substrate 2 is implemented, for example, as a rigid glass plate with relatively high light transmittance, while other electrically insulating materials with desired stability and inert behavior relative to the process steps carried out can equally be used.

The layer structure 3 includes, arranged on the light-entry side surface of the first substrate 2, an opaque rear electrode layer 5, which is made, for example, from a light-impermeable metal such as molybdenum (Mo) and was applied on the first substrate 2 by vapor deposition or magnetron-enhanced cathodic sputtering (sputtering). The rear electrode layer 5 has, for example, a layer thickness in the range from 300 nm to 600 nm.

A photovoltaically active (opaque) absorber layer 6 that is made of a semiconductor doped with metal ions whose bandgap is capable of absorbing the greatest possible share of sunlight is applied on the rear electrode layer 5. The absorber layer 6 is made, for example, of a p-conductive chalcopyrite compound semiconductor, for example, a compound of the group $Cu(In/Ga)(S/Se)_2$, in particular sodium (Na)-doped $Cu(In/Ga)(S/Se)_2$. The preceding formulas are understood to mean that indium (In) or gallium (Ga) as well as sulfur (S) or selenium (Se) can be present alternatively or in combination. The absorber layer 6 has a layer thickness that is, for example, in the range from 1 to 5 µm and is, in particular, approx. 2 µm. Typically, for the production of the absorber layer 6, various material layers are applied, for example, by sputtering, and are subsequently thermally converted to form the compound semiconductor by heating in a furnace (RTP=rapid thermal processing), optionally, in an atmosphere containing S— and/or Se. This manner of production of a compound semiconductor is well known to the person skilled in the art such that it need not be discussed in detail here.

Deposited on the absorber layer 6 is a buffer layer 7, which consists here, for example, of a single layer of cadmium sulfide (CdS) and a single layer of intrinsic zinc oxide (i-ZnO), not depicted in detail in FIG. 1.

A front electrode layer 8 is applied on the buffer layer 7, for example, by sputtering. The front electrode layer 8 is transparent to radiation in the visible spectral range ("window electrode") such that the incoming sunlight (depicted in FIG. 1 by four parallel arrows) is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. A heterojunction (i.e., a sequence of layers of opposing conductor type) is formed by the front electrode layer 8 together with the buffer layer 7 and the absorber layer 6. The buffer layer 7 can effect electronic adaptation between the absorber layer 6 and the front electrode layer 8.

For the formation and serial connection of the solar cells 11, the layer structure 3 was patterned using suitable patterning technology, for example, laser lithography and/or mechanical removal. Typically, a plurality of immediate sequences of three patterning lines P1-P2-P3 in each case in the form of layer ditches are introduced into the layer structure 3 in this order. Here, at least the rear electrode 5 is subdivided by first patterning lines P1; at least the absorber layer, by second patterning lines P2; and at least the front electrode layer 8, by third patterning lines P3 by production of respective ditches. Via the second patterning lines P2, the front electrode layer 8 of one solar cell 11 is in each case electrically conductively connected to the rear electrode layer 5 of an adjacent solar cell 11, with the front electrode layer 8 directly contacting the rear electrode layer 5, for example. In the exemplary embodiment depicted, the ditches of the first patterning lines P1 are filled by material of the absorber layer 6. The ditches of the second patterning lines P2 are filled by material of the front electrode layer 8, and the ditches of the third patterning lines P3 are filled by the adhesive layer 9 mentioned in the following. Each immediate sequence of a first, second, and third patterning line P1-P2-P3 forms a patterning zone 14. In FIG. 1, by way of example, only a single patterning zone 14 is depicted, by means of which the serial connection of two adjacent solar cells 11 is defined, wherein it is understood that in the thin-film solar module 1, a large number of such patterning zones 14 are provided for the patterning and serial connection of solar cells 11.

In the exemplary embodiment depicted here, both the positive power connector (+) and the negative power connector (−) of the thin-film solar module 1 are routed via the rear electrode layer 5 and electrically contacted there. For this purpose, the layers of the layer structure 3 are removed all the way to the rear electrode layer 5 in the two peripheral connection sections 13 of the thin-film solar module 1.

For protection against environmental influences, a (plastic) adhesive layer 9 that serves to encapsulate the layer structure 3 is applied on the front electrode layer 8. Adhesively bonded with the adhesive layer 9 is a second substrate 10 transparent to sunlight that is implemented, for example, in the form of a glass sheet made of extra white glass with a low iron content, with the equally possible use of other electrically insulating materials with desired strengths and inert behavior relative to the process steps carried out. The second substrate 10 serves for the sealing and for the mechanical protection of the layer structure 3. The thin-film solar module 1 can absorb light via the front-side module surface 4 of the second substrate 10 in order to produce an electrical voltage on the two power connectors (+,−). A resulting current path is depicted in FIG. 1 by serially arranged arrows.

The two substrates 2, 10 are fixedly bonded ("laminated") to one another via the adhesive layer 9, with the adhesive layer 9 implemented here, for example, as a thermoplastic adhesive layer, which can be reshaped plastically by heating and which fixedly bonds the two substrates 2, 10 to one another during cooling. The adhesive layer 9 is made here, for example, of PVB. Together, the two substrates 2, 10 with the solar cells 11 embedded in the adhesive layer 9 form a laminated composite 12.

Figure 2:
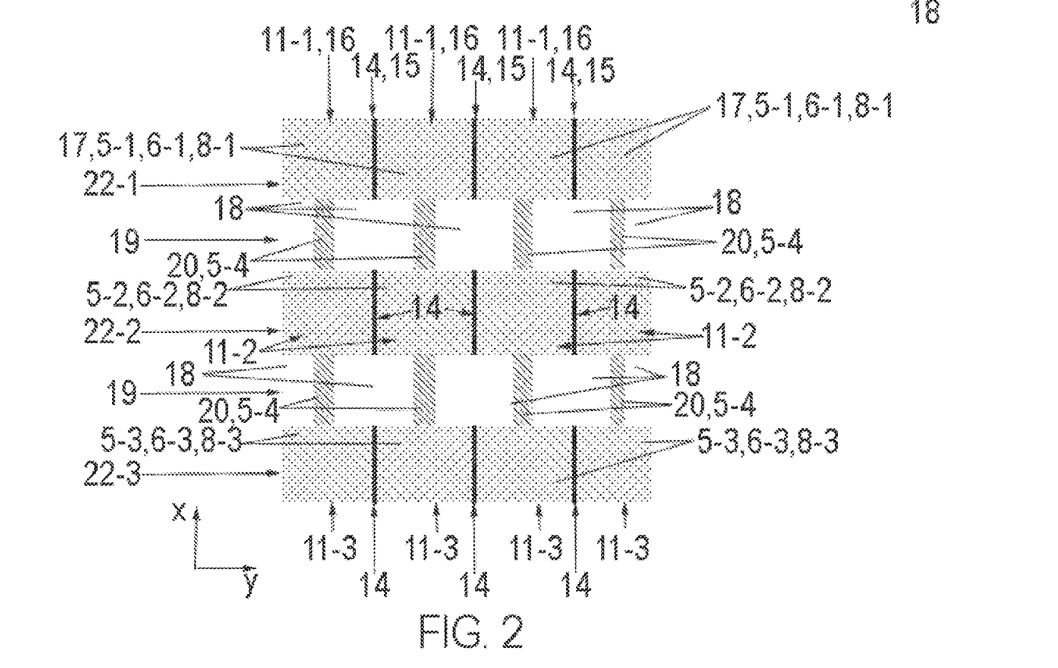
FIG. 2 a schematic representation of an exemplary embodiment of the thin-film solar module according to the invention in plan view.
Figure 3:
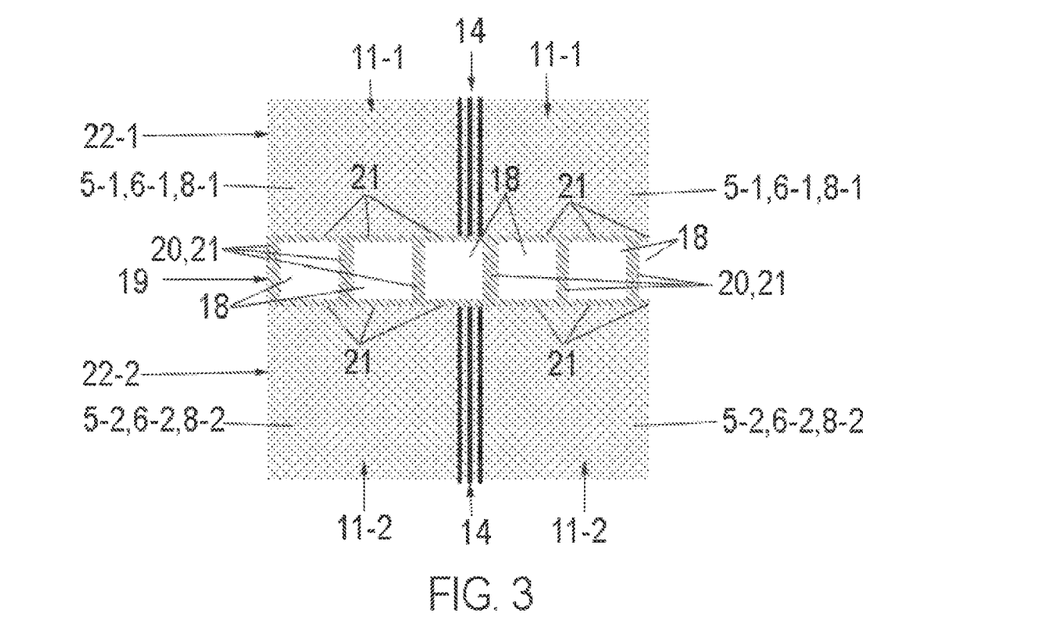
FIG. 3 a schematic representation of another exemplary embodiment of the thin-film solar module according to the invention in plan view.

Reference is now made to FIGS. 2 and 3, wherein, in each case, schematic representations of exemplary embodiments of the thin-film solar module 1 according to the invention are depicted in plan view. The two thin-film solar modules 1 have in each case integrated serial connections of solar cells 11, as were described with reference to FIG. 1.

Considering FIG. 2 first: The square or typically rectangular shape of the thin-film solar module 1 is discernible in plan view. The immediate sequence of the first to third patterning line P1-P2-P3, which are parallel to one another and form patterning zones 14, are depicted in FIG. 2, for the purpose of a simpler representation, in each case as only single lines. The patterning zones 14 form in each case a photovoltaically inactive dead zone 15 that can make no contribution to energy production. As depicted in FIG. 2, the patterning zones 14 are in each case arranged parallel to the module edge, here, for example, in x-direction, which can also be referred to as the width of the thin-film solar module 1. The y-direction perpendicular thereto can be referred to as the length of the thin-film solar module 1. The peripheral connection sections 13 depicted in FIG. 1 are not shown in detail in FIG. 2. The two connection sections 13 also form in each case a photovoltaically inactive dead zone that can make no contribution to energy production.

Situated on both sides adjacent a patterning zone 14 is, in each case, a layer region 16 that represents, in the context of the present invention, a solar cell 11 with a photovoltaically active zone 17. In the inner region of the thin-film solar module 1, each layer region 16 is arranged between two immediately adjacent patterning zones 14 and is delimited thereby. In the case of the two peripheral solar cells 11, the layer region 16 is, in each case, arranged between a patterning zone 14 and the adjacent connector section 13 and is delimited thereby. The layer regions 16 extend in x-direction over the complete dimension of the adjacent patterning zones 14.

As depicted in FIG. 2, the layer structure 3 further includes a plurality of linear decoating regions 19 running perpendicular to the patterning zones 14. Due to the subdivision by the linear decoating regions 19, the serially connected solar cells 11 are subdivided into a plurality of solar cell strings 22-1, 22-2, 22-3, having in each case serially connected solar cells 11-1, 11-2, 11-3. FIG. 2 depicts, by way of example, two linear decoating regions 19 that define three solar cell strings 22-1, 22-2, 22-3. The solar cells of the solar cell strings are positioned opposite one another, with, in each case, two solar cells positioned opposite one another that are immediately adjacent a linear decoating region 19 on both sides of the decoating region 19 and belong to two immediately adjacent solar cell strings forming a pair of solar cells in the context of the present invention. In FIG. 2, the solar cells 11-1, 11-2 positioned opposite one another and arranged on both sides of the upper linear decoating region 19 thus form a solar cell pair. The same is true for the solar cells 11-2, 11-3 positioned opposite one another and arranged on both sides of the lower linear decoating region 19, which likewise form a solar cell pair. The solar cells 11-1 of the first solar cell string include in each case a rear-electrode-layer-section or rear electrode 5-1, an absorber layer section or absorber 6-1, and a front-electrode-layer-section or front electrode 8-1. Correspondingly, the solar cells 11-2 of the second solar cell string 22-2 include in each case a rear electrode layer section or rear electrode 5-2, an absorber layer section or absorber 6-2, and a front electrode layer section or front electrode 8-2; and the solar cells 11-3 of the second solar cell string 22-3 include in each case a rear electrode layer section or rear electrode 5-3, an absorber layer section or absorber 6-3, and a front electrode layer section or front electrode 8-3.

The decoating regions 19 extend in each case continuously over the layer structure 3 over multiple solar cells 11. Each linear decoating region 19 is photovoltaically inactive and is composed of optically transparent zones 18 and electrode zones 20 in alternating sequence, in other words, an optically transparent zone 18 is situated between two electrode zones 20 and/or an electrode zone 20 is situated between two optically transparent zones 18.

Figure 4:
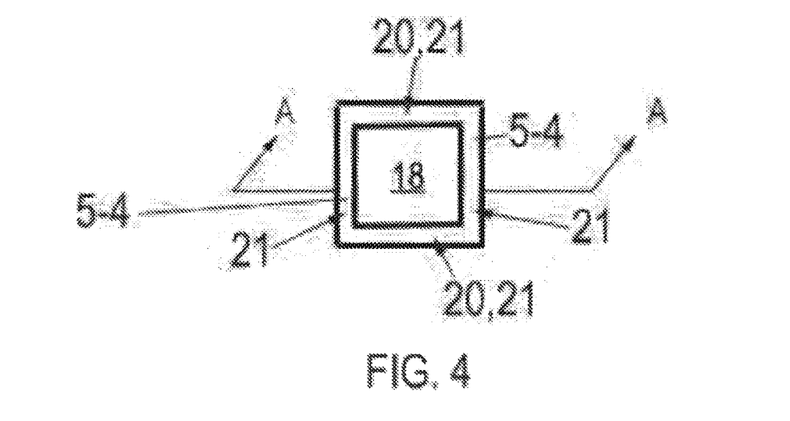
FIG. 4 a schematic representation of an optically transparent zone with a surrounding edge zone.
Figure 5:
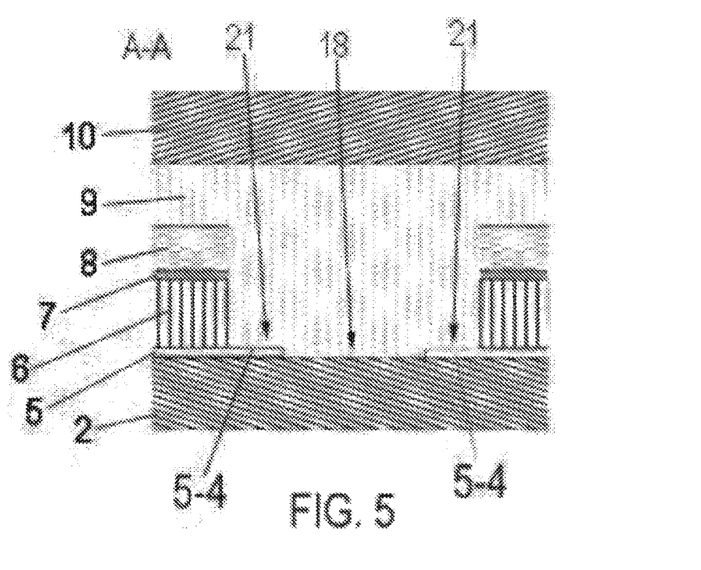
FIG. 5 a cross-sectional view of the optically transparent zone and edge zone of FIG. 4 along section line A-A.

The structure of the optically transparent zones 18 and electrode zones 20 is illustrated in FIGS. 4 and 5. The layer sequence of optically transparent zones 18 and electrode zones 20 is presented in FIG. 5, which is a cross-sectional view of FIG. 4 along the section line A-A. Accordingly, the optically transparent zone 18 is, for achieving the desired optical transparency of the thin-film solar module 1, rear-electrode-layer-free and preferably also absorber-layer-free. As shown in FIG. 5, in the optically transparent zone 18, for example, all layers of the layer structure 3 are removed all the way to the substrate 2 (i.e., rear electrode layer 5, absorber layer 6, buffer layer 7, and front electrode layer 8). However, it is also possible that not all layers of the layer structure 3 are removed in the optically transparent zone 18, with, in any case, the usually opaque rear electrode layer 5 removed.

As shown, the optically transparent zone 18 is surrounded by an edge zone 21, wherein the electrode zones 20 are two sections of the edge zone 21 positioned opposite one another. Accordingly, the layer sequence in the electrode zones 20 and the edge zone 21 containing them is the same. In the electrode zones 20 or edge zone 21, all layers are removed, with the exception of a rear-electrode-layer-section 5-4.

For the further description, reference is now again made to FIG. 2. In contrast to the embodiment of FIGS. 4 and 5, in these embodiments, the optically transparent zones 18 are not completely surrounded by edge zones 21, but, instead, in each case, two electrode zones 20 abut an optically transparent zone 18. The electrode zones 20 are in each case rectangular and extend parallel to the patterning zones 14 in x-direction, wherein they completely bridge the dimension of the linear decoating regions 19 such that the rear-electrode-layer-sections 5-1 and 5-2 or 5-2 and 5-3 of, in each case, two immediately adjacent solar cells 11-1 and 11-2 or 11-2 and 11-3 of a pair of solar cells adjacent one another are areally connected to one another by the rear-electrode-layer-sections 5-4 of the electrode zones 20. The rear electrode 5-1, 5-2, 5-3 of the solar cells 11-1, 11-2, 11-3 arranged in a row perpendicular to the linear decoating regions 19 are thus areally connected to one another by the electrode zones 10. The solar cells 11-1, 11-2, 11-3 arranged in a row perpendicular to the linear decoating regions 19 are thus directly connected electrically to one another in serial connection. Of course, two immediately adjacent rear electrode layer sections 5-1 and 5-2 or 5-2 and 5-3 of the solar cells 11-1, 11-2, 11-3 arranged in a row perpendicular to the linear decoating regions 19 can in each case also be areally bonded to one another by a plurality of electrode zones 20. In FIG. 2, the linear decoating regions 19 are arranged perpendicular to the patterning zones 14, with it being equally possible for them to be arranged obliquely at an angle different from 90° relative to the patterning zones 14.

The photovoltaically active zones 17 or solar cells 11 are opaque and have transmittance for visible light of less than 5%. In contrast to this, the optically transparent zones 18 of the linear decoating regions 19 have transmittance for visible light of at least 85%. The ratio of the total area of all optically transparent zones 18 to the total area of the solar cells 11 is in the range from 5% to 50%. Thus, the optical transparency of the semitransparent thin-film solar module averaged over the total area of the thin-film solar module 1 is also in the range from 5% to 50% and is, in particular, 20%.

The optically transparent zones 18 are arranged uniformly distributed over the thin-film solar module 1 along the linear decoating regions 19, by which means a very smooth overall visual effect can be obtained. By means of the serial connection of the solar cells 11-1, 11-2, 11-3 arranged in a row perpendicular to the linear decoating regions 19, the advantages mentioned in the introduction (e.g., low sensitivity to shading, avoidance of hot spots, potential compensation of layer inhomogeneities) can be achieved.

Reference is now made to FIG. 3, wherein another exemplary embodiment of the thin-film solar module 1 according to the invention is depicted in plan view. In order to avoid unnecessary repetition, only the differences relative to the exemplary embodiment of FIG. 2 are explained and, otherwise, reference is made to the statements there. Accordingly, the optically transparent zones 18 have here in each case the edge zone 21 already described in connection with FIGS. 4 and 5, which completely surrounds the optically transparent zone 18. Each edge zone 21 includes two electrode zones 20 positioned opposite one another, wherein, with the exception on the end of the decoating region 19, one electrode zone 20 belongs to two immediately adjacent edge zones 21. By means of the edge zone 21, short-circuit current paths on the edges of the decoated areas can advantageously be avoided. Advantageously, the ratio of the total area of the optically transparent zones 18 to the total area of the edge zones 21 is greater than 1, preferably greater than 10.

Figure 6:
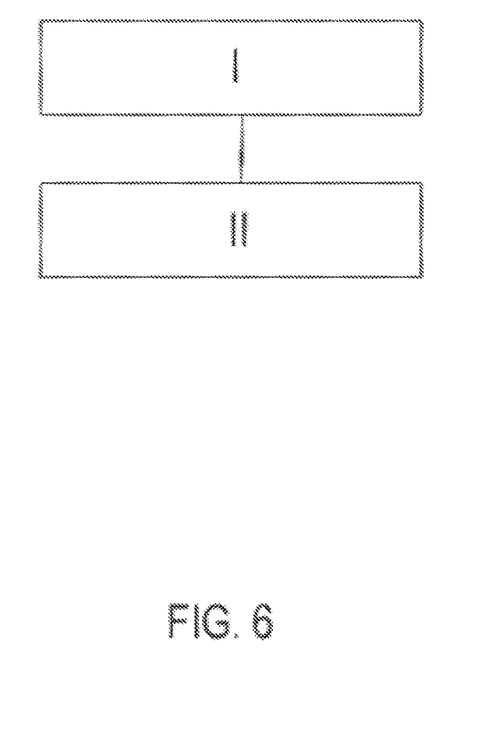
FIG. 6 a flowchart to illustrate an exemplary embodiment of the method according to the invention.

FIG. 6 illustrates an exemplary method for producing the thin-film solar module 1 according to the invention.

According to it, in step I, a substrate 2 with a layer structure 3 applied thereon with patterning zones 14 introduced therein for the formation of serially connected solar cells 11 is provided.

In step II, the linear decoating regions 19 are produced. Here, the optically transparent zones 18 are produced by removal of all layers of the layer structure 3 all the way to the substrate 2 using a pulsed laser beam of a laser beam source. For this purpose, the layer structure 3 is irradiated with a pulsed laser beam, with pulses having a duration of less than 1 nanosecond. The layer structure 3 is preferably irradiated through the transparent substrate 2; however, direct irradiation of the layer structure 3 from the side facing away from the substrate 2 is also possible. Alternatively, the optically transparent zones 18 can be produced by mechanical material removal. In addition, the electrode zones 20 are produced by irradiation of the layer structure 3 with a pulsed laser beam, with pulses having a duration of less than 1 nanosecond, and/or by mechanical material removal. The electrode zones 20 areally bond the rear-electrode-layer-sections 5-1, 5-2, 5-3 of the solar cells 11-1, 11-2, 11-3 arranged in a row transverse to the linear decoating regions 19. The production of the optically transparent zones 18 and of the electrode zones 20 need not necessarily be carried out in temporal succession. Instead, one optically transparent zone 18 and the adjacent electrode zone 20 can be produced in immediate succession.

In an alternative, in step II, edge zones 21, which include the electrode zones 20, are produced around the optically transparent zones 18. The edge zones 21 are produced by irradiation of the layer structure 3 with a pulsed laser beam, with the pulses having a duration of less than 1 nanosecond, and/or by mechanical material removal. When edge zones 21 are produced around the optically transparent zones 18, it is possible to also produce the optically transparent zones 18 by irradiation with a pulsed laser beam, whose pulses have a duration of at least 1 nanosecond.

The invention makes available a thin-film solar module semitransparent to visible light, in which the layer structure is subdivided by linear decoating regions into a plurality of solar cell strings, wherein each linear decoating region has optically transparent zones and electrode zones in alternating sequence. The optically transparent zones can be arranged in relatively complex patterns in a simple manner. A visually appealing division of the surface patterning into small parts can thus be realized in a simple manner. By means of the areally connected rear electrodes of solar cells that are arranged in a row perpendicular to the linear decoating regions, problems with local shading and sites of local overheating due to high current density are prevented. In addition, the disadvantageous effects of layer inhomogeneities can be avoided since the connected rear electrode layer serves as a potential-compensating surface.

As stated in the above description, the invention advantageously enables technically relatively uncomplicated, highly versatile, and economical production of the thin-film solar module, wherein a relatively large optically active area with comparatively high visible-light transmittance of the thin-film solar module can be obtained.

LIST OF REFERENCE CHARACTERS 1 thin-film solar module
2 first substrate
3 layer structure
4 module surface
5 rear electrode layer 5-1,5-2,5-3,5-4 rear electrode layer section
6 absorber layer
6-1,6-2,6-3 absorber layer section
7 buffer layer
8 front electrode layer
8-1,8-2,8-3 front electrode layer section
9 adhesive layer
10 second substrate
11,11-1,11-2-11-3 solar cell
12 composite
13 connection section
14 patterning zone
15 dead zone
16 layer region
17 photovoltaically active zone
18 optically transparent zone
19 decoating region
20 electrode zone
21 edge zone
22-1,22-2,22-3 solar cell string

What is claimed is:

1. A thin-film solar module, comprising:
a first substrate and a layer structure applied thereon, the layer structure comprising a rear electrode layer, a front electrode layer, an absorber layer arranged between the rear electrode layer and the front electrode layer, and an adhesive layer applied between the front electrode layer and a second substrate; and
serially connected solar cells formed in the layer structure by patterning zones having a rear electrode layer section,
wherein
the layer structure comprises at least one linear decoating region subdividing the serially connected solar cells into at least two solar cell strings,
the at least one linear decoating region has an alternating sequence of optically transparent zones and electrode zones,
the optically transparent zones are rear-electrode-layer-free, and the electrode zones are absorber-layer-free, each electrode zone having a rear electrode layer section, and
rear electrode layer sections of at least one pair of solar cells formed one solar cell of a first solar cell string and one solar cell of the second solar cell string of the at least two solar cell strings are areally connected to one another by the rear electrode layer section of at least one electrode zone;
wherein the at least one linear decoating region is arranged perpendicular to the patterning zones or oblique to the patterning zones at an angle different from 90 degrees;
wherein the layer structure has a plurality of linear decoating regions in a parallel arrangement; and
wherein the electrode zones are rectangular and extend parallel to the patterning zones in an x-direction, wherein the electrode zones bridge a dimension of the at least one linear decoating region.

2. The thin-film solar module according to claim 1, wherein the optically transparent zones are absorber-layer-free.

3. The thin-film solar module according to claim 1, wherein the rear electrode layer sections of the at the least one pair of solar cells are not areally connected to one another by the rear electrode layer section of at least one other electrode zone.

4. The thin-film solar module according to claim 1, wherein at least one optically transparent zone is completely surrounded by an immediately adjacent edge zone that is absorber-layer-free.

5. The thin-film solar module according to claim 4, wherein a ratio of the total area of the optically transparent zones to the total area of the edge zones is greater than 1.

6. The thin-film solar module according to claim 4, wherein a ratio of the total area of the optically transparent zones to the total area of the edge zones is greater than 10.

7. The thin-film solar module according to claim 1, wherein a ratio of the total area of the optically transparent zones to the total area of the solar cells is in a range from 0.05 to 0.5.

8. A method for producing the thin-film solar module of claim 1, comprising:
providing a flat substrate;
depositing the rear electrode layer on one side of the flat substrate;
depositing the absorber layer over the rear electrode layer; depositing the front electrode layer over the absorber layer; patterning the rear electrode layer by first patterning lines; patterning the absorber layer by second patterning lines; patterning the front electrode layer by third patterning lines,
wherein a patterning zone is formed by an immediate sequence of a first patterning line, a second patterning line, and a third patterning line, and
wherein the patterning zones form a monolithic serial connection of solar cells, each solar cell having the rear electrode layer;
forming the optically transparent zones, each being rear-electrode-layer-free, by section-wise removal of at least the rear electrode layer; and
forming the electrode zones, each being absorber-layer-free and having the rear electrode layer section, by section-wise removal at least of the absorber layer,
wherein the optically transparent zones and the electrode zones are formed to be arranged in the alternating sequence and form at least one linear decoating region, by which serially connected solar cells are subdivided into at least two solar cell strings, and
wherein the rear electrode layer sections of at least one pair made up of one solar cell of one solar cell string and one solar cell of the other solar cell string are areally connected to one another by the rear electrode layer section of at least one electrode zone.

9. The method according to claim 8, wherein the optically transparent zones are formed by section-wise removal of at least the rear electrode layer by irradiation with a pulsed laser beam and/or by mechanical material removal.

10. The method according to claim 8, wherein the electrode zones are formed by section-wise removal at least of the absorber layer by irradiation with a pulsed laser beam and/or by mechanical material removal.

11. The method according to claim 8, wherein the electrode zones and the edge zones are formed by section-wise removal at least of the absorber layer by irradiation with a pulsed laser beam and/or by mechanical material removal.

12. The method according to claim 8, wherein the optically transparent zones are produced prior to forming the patterning zones, and the electrode zones are produced after forming the patterning zones.

13. The method according to claim 8, wherein the optically transparent zones are produced prior to forming the patterning zones, and the electrode zones and the edge zones are produced after forming the patterning zones.

14. The method according to claim 12, further comprising:
   forming the optically transparent zones by section-wise removal at least of the rear electrode layer prior to depositing the absorber layer; and
   forming the electrode zones after depositing the absorber layer and front electrode layer, and after creating the third patterning lines, by section-wise removal at least of the absorber layer and of the front electrode layer.

15. The method according to claim 13, further comprising:
   forming the optically transparent zones by section-wise removal at least of the rear electrode layer prior to depositing the absorber layer; and
   forming the electrode zones and the edge zones after depositing the absorber layer and front electrode layer, and after creating the third patterning lines, by section-wise removal at least of the absorber layer and of the front electrode layer.

16. The method according to claim 8, wherein the optically transparent zones and electrode zones are produced after forming the patterning zones.

17. The method according to claim 8, wherein the optically transparent zones, electrode zones and the edge zones are produced after forming the patterning zones.

18. The method according to claim 16, wherein optically transparent zones surrounded by edge zones are formed by:
   section-wise removal at least of the absorber layer in processing zones corresponding to the optically transparent zone to be formed and surrounding edge zones, wherein the optically transparent zone is formed in an inner region and the edge zone is formed in an edge region of the processing zone,
   removal at least of the rear electrode layer in the inner region of the processing zones for forming the optically transparent zones, wherein the edge regions of the processing zones form the edge zones.

19. The thin-film solar module according to claim 1, wherein the patterning zones and electrode zones in the linear decocting regions are parallel and offset from each other.

* * * * *